United States Patent
Isowaki et al.

(10) Patent No.: US 8,563,871 B2
(45) Date of Patent: Oct. 22, 2013

(54) COMPOSITE ELECTRONIC PARTS (75) Inventors: Yukio Isowaki, Saku (JP); Tomoyuki Hasegawa, Saku (JP); Hiroyuki Maruta, Saku (JP); Tadashi Otagiri, Nagaya (JP)

(73) Assignees: Soshin Electric Co., Ltd., Saku-Shi (JP); NGK Insulators, Ltd., Nagoya (JP)

( * ) Notice: Subject to any disclaimer, the term of this patent is extended or adjusted under 35 U.S.C. 154(b) by 248 days.

(21) Appl. No.: 13/023,650

(22) Filed: Feb. 9, 2011

(65) Prior Publication Data

US 2011/0162877 A1 Jul. 7, 2011

Related U.S. Application Data (63) Continuation of application No. PCT/JP2009/067311, filed on Sep. 29, 2009.

(30) Foreign Application Priority Data

Sep. 30, 2008 (JP) .................................. 2008-253647

(51) Int. Cl.
*H05K 1/16* (2006.01)
(52) U.S. Cl.
USPC .......................................... 174/260; 428/697
(58) Field of Classification Search
USPC .......................................... 174/260; 428/697
See application file for complete search history.

(56) References Cited

U.S. PATENT DOCUMENTS

| | | | | |
|---|---|---|---|---|
| 3,977,887 A * | 8/1976 | McIntosh | ....................... | 501/134 |
| 4,746,557 A * | 5/1988 | Sakamoto et al. | ............. | 428/138 |
| 4,918,570 A * | 4/1990 | Okamura et al. | ........... | 361/321.2 |
| 4,990,202 A * | 2/1991 | Murata et al. | ............... | 156/89.13 |
| 4,990,323 A * | 2/1991 | Narumi et al. | ................ | 423/598 |
| 5,029,043 A * | 7/1991 | Kitahara et al. | ............ | 361/321.2 |
| 5,318,725 A * | 6/1994 | Sandhage | ...................... | 428/701 |
| 5,476,728 A * | 12/1995 | Nakano et al. | ................ | 428/815 |
| 5,497,129 A * | 3/1996 | Mantese et al. | ................ | 333/182 |
| 5,592,134 A * | 1/1997 | Ogata et al. | ................... | 333/185 |
| 5,665,819 A * | 9/1997 | Tenzer | ....................... | 252/62.61 |
| 6,094,111 A * | 7/2000 | Sunahara | ....................... | 333/184 |
| 6,660,179 B2 * | 12/2003 | Umeda et al. | ................. | 252/62.6 |
| 6,875,526 B2 * | 4/2005 | Umemoto et al. | ........... | 428/692.1 |
| 7,161,795 B1 * | 1/2007 | Megherhi et al. | ........... | 361/321.5 |
| 7,442,483 B2 * | 10/2008 | Kobayashi et al. | ........ | 430/111.3 |

(Continued)

FOREIGN PATENT DOCUMENTS

| | | |
|---|---|---|
| JP | 2001-010820 A1 | 1/2001 |
| JP | 2003-037022 A1 | 2/2003 |

(Continued)

*Primary Examiner* — Timothy Thompson
*Assistant Examiner* — Nathan Milakovich
(74) *Attorney, Agent, or Firm* — Burr & Brown

(57) ABSTRACT

It is provided a composite electronic part having magnetic material and dielectric material and made by co-sintering at a temperature of 1000° C. or lower. The magnetic material comprises a ferrite comprising 46 to 48 mol % of $Fe_2O_3$, 0.1 to 36 mol % of ZnO, 10 to 14 mol % of CuO and the balance being NiO. The dielectric material has a dielectric constant of 1000 or higher, and comprises a barium titanate based dielectric material to which 0.5 to 4.0 weight parts of CuO and 4.0 to 9.0 weight parts of $Bi_2O_3$ are added with respect to 100 weight parts of the barium titanate based dielectric material.

10 Claims, 2 Drawing Sheets

(56) References Cited

U.S. PATENT DOCUMENTS

| | | | |
|---|---|---|---|
| 8,389,603 B2* | 3/2013 | Yadav et al. | 523/200 |
| 2007/0003781 A1* | 1/2007 | de Rochemont | 428/615 |
| 2008/0149882 A1* | 6/2008 | Terazono et al. | 252/62.59 |
| 2008/0218935 A1* | 9/2008 | Symes et al. | 361/301.4 |
| 2009/0009267 A1 | 1/2009 | Miyata et al. | |
| 2009/0011923 A1 | 1/2009 | Hasegawa et al. | |
| 2009/0021326 A1 | 1/2009 | Miyata et al. | |
| 2010/0149725 A1 | 6/2010 | Hasegawa et al. | |
| 2010/0151344 A1* | 6/2010 | Otomaru et al. | 429/444 |
| 2010/0220427 A1* | 9/2010 | Symes et al. | 361/321.4 |

FOREIGN PATENT DOCUMENTS

| | | |
|---|---|---|
| JP | 2003-272912 A1 | 9/2003 |
| JP | 2006-151741 | 6/2006 |
| JP | 2006-151742 A1 | 6/2006 |
| JP | 2007-290940 A1 | 11/2007 |
| JP | 2009-088089 A1 | 4/2009 |
| JP | 2010-235328 A1 | 10/2010 |
| WO | 2006/085625 A1 | 8/2006 |
| WO | 2007/122948 A1 | 11/2007 |

* cited by examiner

COMPOSITE ELECTRONIC PARTS

FIELD OF THE INVENTION

The present invention relates to a composite electronic part.

BACKGROUND OF THE INVENTION

Recently, it is designed to attain miniaturization and density growth of electronic equipment, by integrating a passive part, such as a capacitor or inductor, conventionally mounted on a ceramic substrate surface, within a ceramic multilayer substrate. Such a ceramic multilayer substrate is produced by forming a green sheet from a slurry of a dielectric porcelain composition and an organic solvent by doctor blade method followed by drying, printing a wiring conductor on the top surface of the sheet, forming a laminated body by laminating such green sheets of the same dielectric porcelain composition as described above, and co-firing it.

Such a ceramic multi-layer substrate uses Ag or Cu with small specific resistance as the wiring conductor for performing high-performance signal processing at a high speed. Therefore, various ceramic materials have been developed for co-firing with Ag and Cu at temperatures lower than 962° C., the melting point of Ag, and 1084° C., the melting point of Cu.

For example, a ferrite of $Fe_2O_3$, ZnO, CuO and NiO system is described in Japanese Patent Publication Nos. 2001-10820A and 2003-272912A.

In composite electronic parts having magnetic and dielectric materials and Ag conductors, the dielectric material parts of the most of them has a relative permittivity of 100 or lower. Further, in composite electronic parts of magnetic and dielectric materials having a dielectric material part of a relative permittivity of 100 or more, the dielectric constant is of a level slightly exceeding 100 in the case that the main components of the dielectric material do not include Pb (Japanese patent publication No. 2003-37022A and WO 2006/085625).

Further, the applicant discloses, in Japanese Patent Publication No. 2007-290940A, a dielectric composition having a high dielectric constant without containing lead, which can be fired at a low temperature by adding specific amounts of CaO and $Bi_2O_3$ to barium titanate.

Further, in coil parts, such as a laminated inductor, using a ferrite material as its core, the inductance is lowered as a direct current voltage is applied. Therefore, in electronic parts using superimposed direct current, the reduction of the inductance is a major factor deciding the rated current. It is thus demanded a material having an excellent DC superposition characteristics as the ferrite material used for the core of the coil part, for improving the rated current.

For example, according to Japanese Patent Publication No. 2006-151742A, bismuth oxide and titanium oxide are added to an NiCuZn series ferrite material for improving the DC superposition characteristics.

Further, the applicant discloses, in Japanese Patent Application No. 2009-82211 (Japanese Patent Publication No. 2010-235328A) that specific amounts of bismuth oxide, titanium oxide and barium oxide are added to an NiCuZn series ferrite material for improving the DC superposition characteristics.

In ferrite and LTCC products using Ag conductors, it is possible to attend new needs by combining passive parts having high capacitances. For example, it is necessary a composite electronic part of magnetic and dielectric materials having a higher capacitance for miniaturizing, and reducing the required space of, parts for shielding low frequency noise generated in electric source systems. That is, it is necessary to laminate and integrate a ferrite layer forming a coil or inductor and a high dielectric constant ceramic layer forming a condenser or capacitor. Further, it is necessary that the high dielectric constant ceramic layer and ferrite layer can be densely sintered at a low temperature region of 1000° C. or lower and can be joined with each other without delamination and cracks.

Moreover, between the high dielectric constant ceramic and ferrite layers, the components are diffused to each other during the co-firing, so that the dielectric property tends to be deteriorated. It has not been known a composite electronic part solving these problems.

Besides, the applicant discloses, in Japanese patent application No. 2007-253528 (Japanese Patent Publication No. 2009-88089A), that a low dielectric constant ceramic layer and a high dielectric constant barium titanate based dielectric material having a low dielectric loss and sinterable at a low temperature can be joined with each other by co-sintering without delamination and cracks.

SUMMARY OF THE INVENTION

It has not been, however, disclosed that a ferrite and a high dielectric constant barium titanate based dielectric material having a low dielectric loss and sinterable at a low temperature can be joined with each other by co-sintering without delamination and cracks.

An object of the present invention is to join a barium titanate based material of a high dielectric constant and a ferrite by sintering at a low temperature while preventing delamination and cracks.

The present invention provides a composite electronic part comprising magnetic and dielectric materials, the part being made by co-sintering at a temperature of 1000° C. or lower. The magnetic material is a ferrite comprising 46 to 48 mol % of $F_2O_3$, 0.1 to 36 mol % of ZnO, 10 to 14 mol % of CuO and the balance being NiO. The dielectric material has a dielectric constant of 1000 or higher and comprises a barium titanate based dielectric material to which 0.5 to 4.0 weight parts of CuO and 4.0 to 9.0 weight parts of $Bi_2O_3$ are added with respect to 100 weight parts of the barium titanate based dielectric material.

The present invention further provides a composite electronic part comprising magnetic and dielectric materials, the part being made by co-sintering at a temperature of 1000° C. or lower. The magnetic material comprises 100 weight parts of a ferrite composition comprising 46 to 48 mol % of $Fe_2O_3$, 0.1 to 36 mol % of ZnO, 10 to 14 mol % of CuO and the balance being NiO, and sub-components of 0.8 weight parts or lower of $Bi_2O_3$, 0.9 weight parts or lower of $TiO_2$, and 0.52 weight parts or lower of BaO. The dielectric material has a dielectric constant of 1000 or higher and is a barium titanate based dielectric material to which 0.5 to 4.0 weight parts of CuO and 4.0 to 9.0 weight parts of $Bi_2O_3$ are added with respect to 100 weight parts of the barium titanate based dielectric material.

The inventors have successfully joined the different materials at a sintering temperature of 1000° C. or lower, by improving the respective compositions of a $BaTiO_3$ based dielectric material with a dielectric constant of 1000 or higher and an NiCuZn ferrite of a high magnetic permeability. It is thus made possible to join the high dielectric constant material and ferrite by sintering at a low temperature while preventing the delamination and cracks.

According to the present invention, it is possible to provide an electronic part firmly integrating an NiCuZn ferrite of a high magnetic permeability and a dielectric material of a high dielectric constant by sintering at a low temperature. It is applicable to various uses which have not been applied to date and, for example, it is possible to realize the miniaturization, and reduction of required space of, a noise suppression component.

DETAILED DESCRIPTION OF THE INVENTION (Dielectric Material)

The dielectric material used in the present invention is made by adding 0.5 to 4.0 weight parts of CuO and 4.0 to 9.0 weight parts of $Bi_2O_3$ to 100 weight parts of a barium titanate based dielectric material. The dielectric constant of the dielectric material may preferably be 1000 or more in applications requiring a high dielectric constant such as dielectric condenser. Further, the insulating resistance of the dielectric material may preferably be $1.0 \times 10^{10}$ Ω·cm or more by itself.

The barium titanate-based dielectric material referred to herein means a dielectric material mainly composed of barium titanate. Specifically, it can be, in the raw material stage, a calcined body of barium titanate or a mixture of titanium oxide and barium oxide which produce barium titanate after the sintering. When the whole amount of barium titanate-based dielectric material is 100 mol %, 100 mol % may be entirely composed of barium titanate. Alternatively, 30 mol % or less of the barium site of the dielectric material may be substituted with strontium, calcium or magnesium. Further, 30 mol % or less of the titanium site of the dielectric material may be substituted with zirconium.

According to the present invention, CuO and $Bi_2O_3$ are added to the barium titanate based dielectric material. It is thus possible to improve the bonding strength to the specific ferrite magnetic material.

The method of the addition may be as follows, for example.
(1) CuO and $Bi_2O_3$ are added in the form of separate oxides
(2) A composite oxide of CuO and $Bi_2O_3$ is added.
(3) Both oxides in (1) and the composite oxide in (2) are added.

The composite oxides in (2) and (3) can be produced by calcination. As the composite oxide, $CuBi_2O_4$ may be given as an example.

On the viewpoint of the present invention, 0.5 weight parts or more and 4.0 weight parts or less of CuO and 4.0 weight parts or more and 9.0 weight parts or less of $Bi_2O_3$ are added to 100 weight parts of the barium titanate based dielectric material.

By adding 0.5 weight parts or more of CuO and 4.0 weight parts or more of $Bi_2O_3$ to 100 weight parts of the barium titanate based dielectric material, it is possible to improve the sinterability at a low temperature and the adhesion to the ferrite.

Further, by adding 4.0 weight parts or less of CuO and 9.0 weight parts or less of $Bi_2O_3$ to 100 weight parts of the barium titanate based dielectric material, it is possible to improve the insulating resistance and the adhesion to the ferrite.

It is preferred that the barium titanate based dielectric material of the present invention substantially contains no oxide of Pb, except traces of unavoidable impurities.

The inventive dielectric material does not substantially contain a glass component. As the raw material of each metal component, for example, oxide, nitrate, carbonate and sulfate of each metal may be listed.

[Magnetic Material]

The magnetic material used in the invention comprises a ferrite composition comprising 46 to 48 mol % of $Fe_2O_3$, 0.1 to 36 mol % of ZnO, 10 to 14 mol % of CuO and the balance being NiO.

The phrase "a ferrite composition comprising 46 to 48 mol % of $Fe_2O_3$, 0.1 to 36 mol % of ZnO, 10 to 14 mol % of CuO and the balance being NiO" means that the main magnetic ferrite composition is consisting of the four components. The total amount of the four components is calculated as 100 mol %.

According to a preferred embodiment, the dielectric material is consisting of 46 to 48 mol % of $Fe_2O_3$, 0.1 to 36 mol % of ZnO, 10 to 14 mol % of CuO and the balance being NiO.

Further, the magnetic material may preferably have a insulating resistance of $1.0 \times 10^{10}$ Ω·cm or more.

By setting the content of $Fe_2O_3$ to 48 mol % or less, the insulating resistance can be improved. By setting the content of $Fe_2O_3$ to 46 mol % or more, the magnetic permeability can be improved. From that viewpoint, the content of $Fe_2O_3$ is more preferably 47 mol % or more.

By setting the content of ZnO to 0.1 mol % or more, the sinterability at a low temperature can be improved. From that viewpoint, the content of ZnO is preferably 4.0 mol % or more, and more preferably, 15 mol % or more. Further, by setting the content of ZnO to 36 mol % or less, the magnetic permeability can be assured. From that viewpoint, the content of ZnO os more preferably be 30 mol % or less.

By setting the content of CuO to 10 mol % or more, the sinterability at a low temperature can be improved. From that viewpoint, the content of CuO is preferably 11 mol % or more. Further, by setting the content of CuO to 14 mol % or less, the excessive sintering can be prevented. From that viewpoint, the content of CuO is more preferably be 12 mol % or less.

Further, 0.8 weight parts or lower of $Bi_2O_3$, 0.9 weight parts or lower of $TiO_2$, and 0.52 weight parts or lower of BaO may be added to 100 weight parts of the ferrite composition. It is thus possible to improve the DC superposition characteristics of the magnetic material.

From that viewpoint, the content of $Bi_2O_3$ is preferably 0.2 weight parts or more, and 0.7 weight parts or less.

Further, the content of $TiO_7$ is preferably 0.4 weight parts or more, and 0.6 weight parts or less.

Further, the content of BaO is preferably 0.2 weight parts or more, and 0.4 weight parts or less.

(Co-Sintering Temperature)

The inventive part may preferably be co-sintered at a temperature of 900 to 1000° C. The sintering is difficult at a temperature below 900° C. By setting the sintering temperature to 1000° C. or lower, extensive development of the applications can be attained with a great industrial advantage. The sintering temperature is further preferably 980° C. or lower. When Ag, Ag alloy or the like is used as the conductor, it is preferred to set the sintering temperature to 950° C. or lower.

[Embodiments of Integration of Magnetic and Dielectric Materials]

Figure 1:
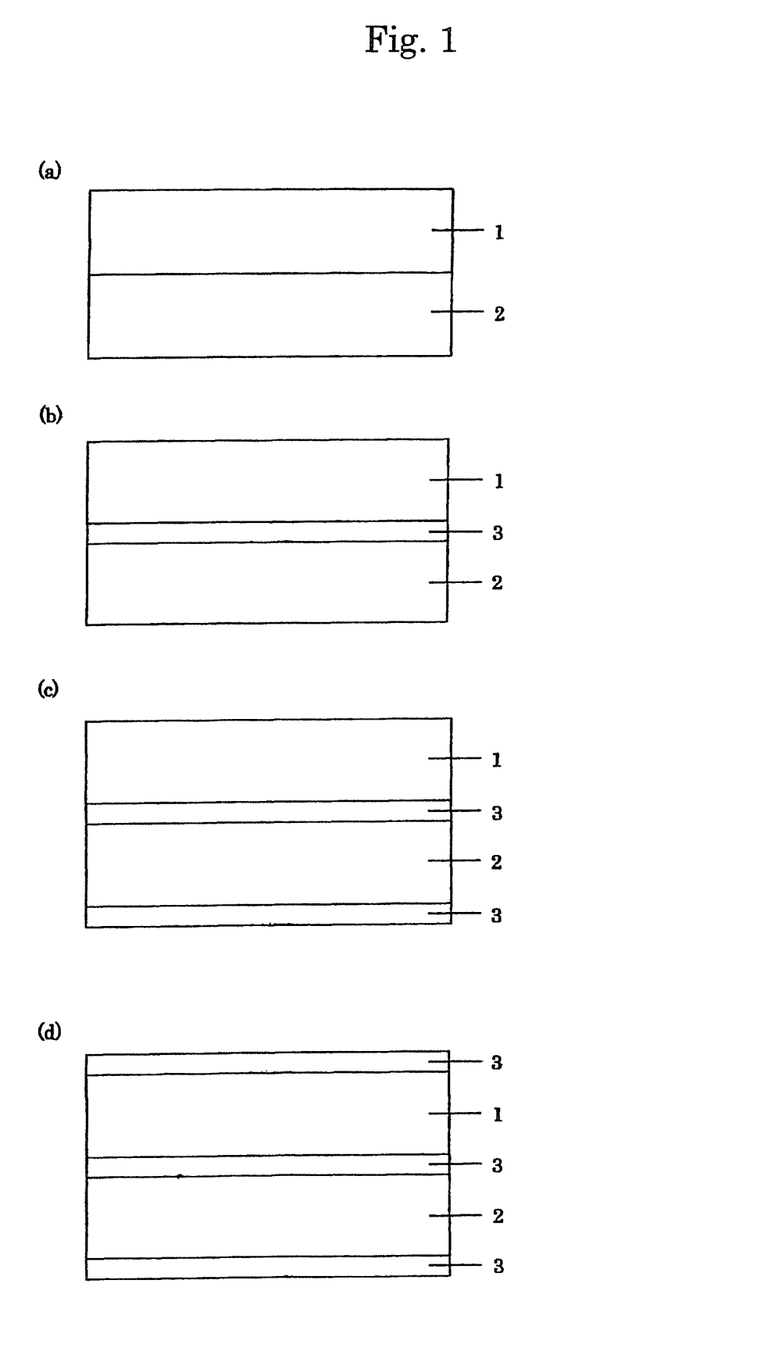
FIG. 1(a) shows a co-sintered body of a dielectric material 1 and a magnetic material 2.
FIGS. 1(b), 1(c) and 1(d) show co-sintered bodies of a dielectric material 1, an intermediate layer 3 and a magnetic material 2, respectively.

According to the present invention, as shown in FIG. 1(a), the dielectric material 1 and magnetic material 2 may be directly contacted and joined with each other. Alternatively, the dielectric material and magnetic material 2 may be integrated through an intermediate layer interposed between then. That is, as shown in FIG. 1 (b), the intermediate layer 3 may be provided between the dielectric material 1 and magnetic material 2. Further, as shown in FIGS. 1 (c) and 1 (d), the intermediate layers 3 may be provided on the both sides of the magnetic layer and dielectric layer, respectively.

[Material of Intermediate Layer]

As the material of the intermediate layer, it is preferred that 8 weight parts or less of CuO is added to 100 weight parts of $BaO-TiO_2-ZnO$ material. More preferably, the material of the intermediate layer is a porcelain having a composition of $xBaO-yTiO_2-zZnO$ ("x", "y" and "z" represent molar ratios, respectively, and satisfy the relationships: $x+y+z=1$; $0.095 \leq x \leq 0.20$; $0.49 \leq y \leq 0.61$; $0.19 \leq z \leq 0.42$). Within the composition range, the adhesion of the intermediate layer to the dielectric and magnetic materials is particularly improved after the co-sintering.

The ratio "x" of BaO in the porcelain for the intermediate layer may more preferably be 0.11 or more, and more preferably be 0.15 or less. Further, the ratio "y" of $TiO_2$ in the porcelain may more preferably be 0.5 or more, and more preferably be 0.6 or less. Further, the ratio "z" of ZnO in porcelain may more preferably be 0.3 or more and more preferably be 0.4 or less.

1.0 weight parts or more and 5.0 weight parts or less of the glass component containing boron oxide may be added to 100 weight parts of the porcelain, so that the sintering temperature of the intermediate layer can be effectively lowered.

The glass component containing boron oxide mentioned herein means a glass component containing at least boron oxide. Although the glass component may be composed of boron oxide only, the glass component may preferably contain a metal oxide other than boron oxide. The metal oxide component other than boron oxide includes BaO, $Al_2O_3$, ZnO, $SiO_2$ and a alkaline metal oxide.

[Production]

According to the present invention, the ratio of each metal oxide component is an equivalent for each metal oxide in the raw material mixture. The equivalent for each metal oxide in the raw material mixture is determined by the mixing ratio of each metal raw material in the mixture. In the present invention, the mixing ratio of each metal raw material is weighed by a precision scale, and the equivalent is calculated based on the weighed value.

The electronic part of the present invention may preferably have a conductive pattern made of a material selected from the group consisting of Ag, Cu and Ag—Pd alloy.

Preferably, the electronic part of the present invention has a pair of electrode layers, and the high dielectric constant ceramic layer is positioned between the pair of the electrode layers, so that the pair of the electrode layers provides a predetermined amount of electrostatic capacity.

When the electronic part of the present invention is produced, preferably, each metal oxide powder is weighed and wet-mixed at a predetermined composition, for both of the dielectric material and magnetic material. Thereafter, the resulting mixed powder for the dielectric material is calcined at 900 to 1200° C. (preferably 1000 to 1100° C.), and the mixed powder for the magnetic material is calcined at 740 to 840° C. Both calcined bodies are pulverized to give ceramic powders, respectively. Each ceramic powder may preferably be mixed with an organic binder, a softening agent, a dispersant and an organic solvent, and then molded into sheets by doctor blade method. The resulting molded sheets are laminated to obtain a laminated body. The laminated body is co-sintered at 900 to 1000° C. to obtain the electronic part.

[Applications of Composite Electronic Part]

The electronic part of the present invention is not particularly limited, as far as the high magnetic permeability of the ferrite and the high dielectric constant of the dielectric material are utilized. As the kind of the electronic part, a filter having passive devices of L and C and a noise suppression component may be listed.

Figure 2:
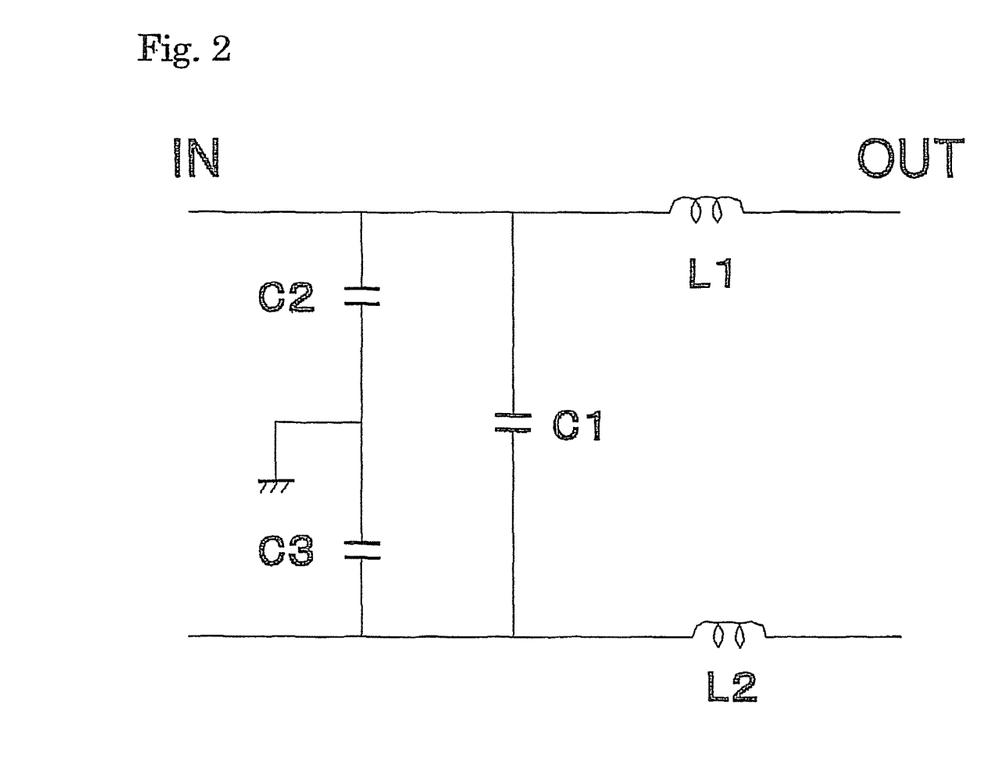
FIG. 2 is a circuit diagram showing an example of an equivalent circuit of a noise suppression component.

The noise suppression component means an electronic part for eliminating radiation of electromagnetic noise leaked from electronic devices or noise interfering another device. FIG. 2 is a diagram showing an example of an equivalent circuit for noise suppression.

EXAMPLES (Experiment A)

(Production of Raw Material of Dielectric Material)

Oxide powders were weighed in accordance with predetermined compositions and wet-mixed to obtain mixed powder. The mixed powder was calcined at 1000 to 1100° C. Predetermined amounts of CuO and $Bi_2O_3$ were added to the thus obtained calcined body and then pulverized to obtain powdery raw material for the high dielectric material.

(Production of Raw Material of Magnetic Material)

Oxide powders were weighed in accordance with predetermined compositions and wet-mixed to obtain mixed powder. The mixed powder was calcined at 740 to 840° C. The calcined body was then pulverized to obtain ceramic powdery raw material.

(Tape Casting)

An organic binder, a softening agent, a dispersant and an organic solvent were added to the thus prepared powdery raw material and mixed in a ball mill to obtain a slurry. The slurry was used to mold green sheets each having a thickness of 0.02 to 0.1 mm with a doctor blade system.

(Adhesive Property, Bending Strength Test)

The ceramic green sheets (40 μm) for the magnetic material and ceramic green sheets (40 μm) for the high dielectric constant material were laminated at a ratio of 1:1 and sintered to obtain a sintered body, from which a test piece of about 3 mm×30 mm×2 mm was cut out and subjected to three-points bending strength test. The adhesive property was judged by mirror polishing the similar structure and observing cracks, spaces and mutual diffusion along the joining interface with an electron microscope.

(Measurement of Dielectric Constant)

The magnetic material ceramic green sheets (40 μm) and high dielectric constant ceramic green sheets (40 μm) were laminated at a ratio of 1:1 and sintered to obtain a structure. Electrode patterns were formed in the structure by screen printing so that a part of the high dielectric constant layer forms a capacitor layer in advance (an area of overlapping of the electrodes was 2 $mm^2$ after the sintering). Terminal electrodes were thus formed. The capacitance was then measured using the terminal electrodes.

(Insulating Resistance)

The magnetic material ceramic green sheets (40 μm) and high dielectric constant ceramic green sheets (40 μm) were sintered to obtain sintered bodies, so as to have dimensions of about 10 mm×10 mm×1.5 mm. counter electrodes were formed thereon and the insulating resistance was measured using an insulating resistance meter by applying 50 volts.

(Confirmation of Sinterability)

The sintered bodies of the magnetic and high dielectric materials were observed at a magnitude of 10000 to calculate the occupation ratio of holes for the judge.

The results of the measurements were shown in tables 1, 2 and 3.

TABLE 1

| Sample No | Sintering Temperature (° C.) | High dielectric constant material ||||||  Magnetic material ||||||  Bending strength MPa | Adhesive property | Evaluation |
|---|---|---|---|---|---|---|---|---|---|---|---|---|---|---|---|
| | | BaTiO3 Weight Parts | CuO Weight Parts | Bi2O3 Weight Parts | Dielectric Constant | Insulating Resistance Ω | Sinterability | Fe2O3 mol % | NiO mol % | CuO mol % | ZnO mol % | Sinterability | | | |
| 1 | 900 | 100 | 0.32 | 3.76 | 670 | 4.0E+08 | X | 48 | 24.8 | 11.8 | 15.5 | ○ | 110 | X | X |
| 2 | 900 | 100 | 0.44 | 2.56 | 920 | 2.3.E+09 | X | 48 | 24.8 | 11.8 | 15.5 | ○ | 125 | X | X |
| 3 | 900 | 100 | 0.51 | 2.99 | 1080 | 4.0.E+10 | Δ | 48 | 24.8 | 11.8 | 15.5 | ○ | 145 | X | X |
| 4 | 900 | 100 | 0.51 | 4.27 | 1189 | 4.0.E+10 | ○ | 48 | 24.8 | 11.8 | 15.5 | ○ | 163 | Δ | ○ |
| 5 | 900 | 100 | 0.73 | 4.27 | 1305 | 5.0.E+10 | ○ | 48 | 24.8 | 11.8 | 15.5 | ○ | 169 | Δ | ○ |
| 6 | 920 | 100 | 0.73 | 4.27 | 1425 | 8.0.E+10 | ○ | 48 | 24.8 | 11.8 | 15.5 | ○ | 188 | ○ | ○ |
| 7 | 900 | 100 | 0.87 | 5.13 | 1345 | 2.0.E+10 | ○ | 48 | 24.8 | 11.8 | 15.5 | ○ | 176 | Δ | ○ |
| 8 | 900 | 100 | 1.31 | 7.69 | 1554 | 3.5.E+10 | ○ | 48 | 24.8 | 11.8 | 15.5 | ○ | 185 | ○ | ○ |
| 9 | 900 | 100 | 1.75 | 10.25 | 2023 | 2.9.E+08 | ○ | 48 | 24.8 | 11.8 | 15.5 | ○ | 136 | X | X |
| 10 | 900 | 100 | 2.87 | 5.13 | 1260 | 2.0.E+11 | ○ | 48 | 24.8 | 11.8 | 15.5 | ○ | 179 | Δ | ○ |

According to table 1, the ratios of CuO and $B_2O_3$ of the dielectric material were variously changed. As a result, the sinterability of the magnetic and dielectric materials was good and the bending strength of the co-sintered product was high in the samples 4 to 8 and 10. According to the samples 1 and 2, the ratios of CuO and $B_2O_3$ of the dielectric material and the bending strength were low. According to the sample 3, the ratio of $B_2O_3$ of the dielectric material and bending strength were low. According to the sample 9, the ratio of $B_2O_3$ of the dielectric material was high and bending strength was low.

TABLE 2

| Sample No | Sintering Temperature (° C.) | High dielectric constant material ||||||  Magnetic material ||||||  Bending strength MPa | Adhesive property | Evaluation |
|---|---|---|---|---|---|---|---|---|---|---|---|---|---|---|---|
| | | BaTiO3 Weight Parts | CuO Weight Parts | Bi2O3 Weight Parts | Dielectric Constant | Insulating Resistance Ω | Sinterability | Fe2O3 mol % | NiO mol % | CuO mol % | ZnO mol % | Sinterability | | | |
| 11 | 900 | 100 | 3.02 | 5.98 | 1510 | 2.5.E+10 | ○ | 48 | 24.8 | 11.8 | 15.5 | ○ | 186 | ○ | ○ |
| 12 | 900 | 100 | 3.17 | 6.83 | 1650 | 8.0.E+10 | ○ | 48 | 24.8 | 11.8 | 15.5 | ○ | 203 | ○ | ○ |
| 13 | 880 | 100 | 3.31 | 7.69 | 1210 | 1.5.E+10 | ○ | 48 | 24.8 | 11.8 | 15.5 | Δ | 185 | ○ | ○ |
| 14 | 900 | 100 | 3.31 | 7.69 | 1720 | 2.5.E+11 | ○ | 48 | 24.8 | 11.8 | 15.5 | ○ | 220 | ○ | ○ |
| 15 | 920 | 100 | 3.31 | 7.69 | 1830 | 2.2.E+11 | ○ | 48 | 24.8 | 11.8 | 15.5 | ○ | 234 | ○ | ○ |
| 16 | 900 | 100 | 4.11 | 7.69 | 1485 | 7.0.E+09 | Δ | 48 | 24.8 | 11.8 | 15.5 | ○ | 205 | ○ | X |
| 17 | 900 | 100 | 5.31 | 7.69 | 1355 | 1.8.E+09 | Δ | 48 | 24.8 | 11.8 | 15.5 | ○ | 195 | ○ | X |
| 18 | 900 | 100 | 3.53 | 8.97 | 1870 | 2.0.E+10 | ○ | 48 | 24.8 | 11.8 | 15.5 | ○ | 231 | ○ | ○ |
| 19 | 900 | 100 | 3.75 | 10.25 | 2668 | 3.6.E+09 | ○ | 48 | 24.8 | 11.8 | 15.5 | ○ | 155 | X | X |

As shown in table 2, the ratios of CuO and $Bi_2O_3$ of the dielectric material were variously changed. As a result, the sinterability of the magnetic and dielectric materials was good and the bending strength of the co-sintered product was high in the samples 11 to 15 and 18. In samples 16 and 17, the ratio of CuO of the dielectric material was high and the insulting resistance of the dielectric material was low. According to the sample 19, the ratio of $Bi_2O_3$ of the dielectric material was high and the adhesion property was poor.

TABLE 3

| Sample No | Sintering Temperature (° C.) | High dielectric constant material ||| Magnetic material |||||  Sinterability | Bending strength MPa | Adhesive property | Evaluation |
|---|---|---|---|---|---|---|---|---|---|---|---|---|---|
| | | BaTiO3 Weight Parts | CuO Weight Parts | Bi2O3 Weight Parts | Fe2O3 mol % | NiO mol % | CuO mol % | ZnO mol % | Insulating Resistance Ωm | | | | |
| 20 | 900 | 100 | 3.31 | 7.69 | 50 | 12.3 | 11.3 | 26.4 | 2.5E+06 | ○ | 180 | ○ | X |
| 21 | 900 | 100 | 3.31 | 7.69 | 49.5 | 12.4 | 11.4 | 26.7 | 1.9E+08 | ○ | 195 | ○ | X |
| 22 | 900 | 100 | 3.31 | 7.69 | 49 | 12.5 | 11.6 | 26.9 | 9.5E+09 | ○ | 191 | ○ | X |
| 23 | 900 | 100 | 3.31 | 7.69 | 48.5 | 12.6 | 11.7 | 27.2 | 8.3E+09 | ○ | 210 | ○ | X |
| 24 | 900 | 100 | 3.31 | 7.69 | 48 | 12.8 | 11.8 | 27.5 | 2.0E+11 | ○ | 207 | ○ | ○ |
| 25 | 900 | 100 | 3.31 | 7.69 | 48 | 8.8 | 11.8 | 31.5 | 1.8E+11 | ○ | 205 | ○ | ○ |
| 26 | 900 | 100 | 3.31 | 7.69 | 48 | 16.8 | 11.8 | 23.5 | 8.7E+10 | ○ | 207 | ○ | ○ |
| 27 | 900 | 100 | 3.31 | 7.69 | 48 | 20.8 | 11.8 | 19.5 | 3.1E+10 | ○ | 203 | ○ | ○ |
| 14 | 900 | 100 | 3.31 | 7.69 | 48 | 24.8 | 11.8 | 15.5 | 1.7E+10 | ○ | 210 | ○ | ○ |
| 28 | 900 | 100 | 3.31 | 7.69 | 47.5 | 12.9 | 11.9 | 27.7 | 1.1E+10 | ○ | 224 | ○ | ○ |

TABLE 3-continued

| | | High dielectric constant material | | | Magnetic material | | | | | | | | |
|---|---|---|---|---|---|---|---|---|---|---|---|---|---|
| Sample No | Sintering Temperature (°C.) | BaTiO3 Weight Parts | CuO Weight Parts | Bi2O3 Weight Parts | Fe2O3 mol % | NiO mol % | CuO mol % | ZnO mol % | Insulating Resistance Ωm | Sinterability | Bending strength MPa | Adhesive property | Evaluation |
| 29 | 900 | 100 | 3.31 | 7.69 | 47 | 37.0 | 12.0 | 4.0 | 1.0E+10 | ○ | 205 | ○ | ○ |
| 30 | 900 | 100 | 3.31 | 7.69 | 47 | 40.0 | 12.0 | 1.0 | 1.1E+10 | ○ | 180 | ○ | ○ |
| 31 | 900 | 100 | 3.31 | 7.69 | 46 | 41.0 | 12.0 | 1.0 | 2.0E+10 | ○ | 197 | ○ | ○ |
| 32 | 900 | 100 | 3.31 | 7.69 | 45 | 42.0 | 12.0 | 1.0 | 6.6E+09 | Δ | 175 | Δ | X |
| 33 | 900 | 100 | 3.31 | 7.69 | 47 | 40.9 | 12.0 | 0.1 | 1.6E+10 | ○ | 195 | ○ | ○ |
| 34 | 900 | 100 | 3.31 | 7.69 | 47 | 41.0 | 12.0 | 0.0 | 7.5E+08 | X | 150 | X | X |

As shown in table 3, the ratios of the components of the magnetic material were variously changed. As a result, according to the samples 20 to 23, the ratio of $Fe_2O_3$ was high and the insulating resistance of the magnetic material was low. According to the sample 32, the ratio of $Fe_2O_3$ and the insulating resistance of the magnetic material were low. According to the sample 34, ZnO was not added and the sinterability of the magnetic material was poor.

(Experiment B)

Laminated bodies were produced as described in the Experiment A. However, an intermediate layer was formed between the dielectric and magnetic materials as follows.

Oxide powders were weighed and wet-mixed according to a predetermined composition to obtain mixed powder for the low dielectric porcelain. Thereafter, the material for the low dielectric porcelain was calcined at 1050 to 1300° C. to obtain a calcined body, which was then pulverized to obtain each ceramic powdery raw material.

(Production of Glass)

A glass having a composition of $B_2O_3$—$SiO_2$—$Al_2O_3$—BaO was produced. Oxides forming the glass components were weighed and wet-mixed to obtain the respective mixtures. Thereafter, each mixture was melted in a platinum crucible to obtain molten mixture, which was then rapidly cooled in water to obtain a bulk of a glass. The glass was wet-ground to obtain each glass powder.

(Production of Material for Intermediate Layer)

The thus obtained calcined body, the glass and optionally a predetermined amount of CuO were mixed and pulverized to obtain powdery raw material for the low dielectric ceramic material. The dielectric constants and Q values (at 3 GHz) of the compositions for the intermediate layers shown in tables 4 and 5 were 20 to 30 and 3000 or higher, respectively.

When the laminated green sheets were produced, the green sheet for the intermediate layer was inserted between the green sheets for the magnetic material and dielectric material to obtain a laminated body. The thickness of the intermediate layer was made 40 μm. The laminated bodes were then sintered at temperatures shown in tables 4 and 5. The above described tests were carried out for the thus obtained sintered bodies and the test results were shown in tables 4 and 5.

TABLE 4

| | Sintering | High dielectric constant material | | | Magnetic material | | | | Intermediate Layer | | | | Bending | Ad- | |
|---|---|---|---|---|---|---|---|---|---|---|---|---|---|---|---|
| | Temper- | BaTiO3 | CuO | Bi2O3 | | | | | xBaO—yTiO2—zZnO | | | | | | |
| Sample | ature | Weight | Weight | Weight | Fe2O3 | NiO | CuO | ZnO | (mol %) | | | CuO | strength | hesive | |
| No | (□) | Parts | Parts | Parts | mol % | mol % | mol % | mol % | X | Y | Z | wt % | MPa | property | Evaluation |
| 13 | 880 | 100 | 3.31 | 7.69 | 48 | 24.8 | 11.8 | 15.5 | | | | | 175 | Δ | ○ |
| 14 | 900 | 100 | 3.31 | 7.69 | 48 | 24.8 | 11.8 | 15.5 | | | | | 210 | ○ | ○ |
| 35 | 880 | 100 | 3.31 | 7.69 | 48 | 24.8 | 11.8 | 15.5 | 11 | 54 | 35 | 4 | 210 | ○ | ○ |
| 36 | 900 | 100 | 3.31 | 7.69 | 48 | 24.8 | 11.8 | 15.5 | 11 | 54 | 35 | 0 | 214 | ○ | ○ |

TABLE 5

| | Sintering | High dielectric constant material | | | Magnetic material | | | | Intermediate Layer | | | | Bending | Ad- | |
|---|---|---|---|---|---|---|---|---|---|---|---|---|---|---|---|
| | Temper- | BaTiO3 | CuO | Bi2O3 | | | | | xBaO—yTiO2—zZnO | | | | | | |
| Sample | ature | Weight | Weight | Weight | Fe2O3 | NiO | CuO | ZnO | (mol %) | | | CuO | strength | hesive | |
| No | (°C.) | Parts | Parts | Parts | mol % | mol % | mol % | mol % | X | Y | Z | wt % | MPa | property | Evaluation |
| 37 | 900 | 100 | 3.31 | 7.69 | 48 | 24.8 | 11.8 | 15.5 | 11 | 54 | 35 | 2 | 236 | ○ | ○ |
| 38 | 900 | 100 | 3.31 | 7.69 | 48 | 24.8 | 11.8 | 15.5 | 11 | 54 | 35 | 4 | 250 | ○ | ○ |
| 39 | 900 | 100 | 3.31 | 7.69 | 48 | 24.8 | 11.8 | 15.5 | 11 | 54 | 35 | 8 | 235 | ○ | ○ |
| 40 | 900 | 100 | 3.31 | 7.69 | 48 | 24.8 | 11.8 | 15.5 | 11 | 54 | 35 | 10 | 190 | Δ | Δ |
| 41 | 900 | 100 | 3.75 | 10.25 | 48 | 24.8 | 11.8 | 15.5 | 11 | 54 | 35 | 4 | 176 | Δ | X |
| 42 | 880 | 100 | 3.31 | 7.69 | 48 | 24.8 | 11.8 | 15.5 | 9 | 61 | 30 | 4 | 215 | ○ | ○ |
| 43 | 900 | 100 | 3.31 | 7.69 | 48 | 24.8 | 11.8 | 15.5 | 9 | 61 | 30 | 4 | 230 | ○ | ○ |
| 44 | 880 | 100 | 3.31 | 7.69 | 48 | 24.8 | 11.8 | 15.5 | 20 | 49 | 31 | 4 | 210 | ○ | ○ |
| 45 | 900 | 100 | 3.31 | 7.69 | 48 | 24.8 | 11.8 | 15.5 | 20 | 49 | 31 | 4 | 228 | ○ | ○ |

As shown in table 4, the presence or absence of the intermediate layer was selected. As a result, when the samples 13 and 35 were compared with the samples 14 and 36, the bending strength was higher in the samples 35 and 36 having the intermediate layers.

As shown in table 5, the ratios of the components of the intermediate layer were variously changed. As a result, in the sample 40, the ratio of CuO of the intermediate layer was high and the adhesive property was poor. In the sample 41, the ratio of $Bi_2O_3$ in the dielectric material was high and the adhesive property was poor. Good results were obtained in the other samples 37 to 39 and 42 to 45.

(Experiment C)
(Production of Raw Material of Dielectric Material)

Oxide powders were weighed according to predetermined compositions shown table 6 and wet-mixed to obtain mixed powders. The mixed powder was then calcined at a temperature of 1000 to 1100° C. to obtain a calcined body. Predetermined amounts of CuO and $Bi_2O_3$ were added to the thus obtained calcined body and then pulverized to obtain powdery raw material of the high dielectric material.

(Production of Raw Material of Magnetic Material)

Oxide powders were weighed according to predetermined compositions shown in table 6 and wet-mixed to obtain mixed powders. The mixed powder was then calcined at 740 to 840° C. to obtain a calcined body, which was then pulverized to obtain ceramic powdery raw material.

(Tests)

The thus obtained raw material was used and subjected to tape casting according to the method described in the Experiment A. The adhesion property, bending strength, dielectric constant, insulating resistance and sinterability were confirmed.

The following tests were performed further.

(Production of a Sample for Measuring Magnetic Permeability)

The ceramic green sheet (40 μm) for the magnetic material was sintered to have dimensions of about 18 mm×18 mm×1.6 mm after the sintering. The sintered body was then cut out to a ring shaped body having an outer diameter of 16 mm and an inner diameter of 10 mm to provide a toroidal core. Cords (winding wires) were wound onto the thus obtained toroidal core 17 times to obtain a sample.

(Measurement of DC Superposition Characteristics)

DC current was flown through the sample to measure the change of the magnetic permeability, so that the relationship between the magnetic permeability and DC current was used to draw a graph. The thus obtained graph was used to calculate the DC superposition characteristics, which is an intensity of magnetic field when the initial magnetic permeability μi at a DC current of 0 mA is reduced by 10 percent.

(Calculation of DC Superposition Coefficient)

The initial magnetic permeability was multiplied to the thus calculated DC superposition characteristics to obtain a DC superposition coefficient. The results were shown in table 6.

TABLE 6

| Sample No. | Sintering temperature ° C. | High dielectric material | | | Magnetic material | | | | Sub-Components (Weight Parts) | | |
|---|---|---|---|---|---|---|---|---|---|---|---|
| | | $BaTiO_3$ | CuO | $Bi_2O_3$ | $Fe_2O_3$ | NiO | CuO | ZnO | $Bi_2O_3$ | $TiO_2$ | BaO |
| | | Weight Parts | | | mol % | | | | | | |
| 27 | 900 | 100 | 3.31 | 7.69 | 48 | 20.8 | 11.8 | 19.5 | 0 | 0 | 0 |
| A1 | 900 | 100 | 3.31 | 7.69 | 48 | 20.8 | 11.8 | 19.5 | 0 | 0.45 | 0.23 |
| A2 | 900 | 100 | 3.31 | 7.69 | 48 | 20.8 | 11.8 | 19.5 | 0.25 | 0.45 | 0.23 |
| A3 | 900 | 100 | 3.31 | 7.69 | 48 | 20.8 | 11.8 | 19.5 | 0.25 | 0.27 | 0.18 |
| A4 | 900 | 100 | 3.31 | 7.69 | 48 | 20.8 | 11.8 | 19.5 | 0.25 | 0.68 | 0.18 |
| A5 | 900 | 100 | 3.31 | 7.69 | 48 | 20.8 | 11.8 | 19.5 | 0.06 | 0.11 | 0.06 |
| A6 | 900 | 100 | 3.31 | 7.69 | 48 | 20.8 | 11.8 | 19.5 | 0.31 | 0.56 | 0.29 |
| A7 | 900 | 100 | 3.31 | 7.69 | 48 | 20.8 | 11.8 | 19.5 | 0.8 | 0.6 | 0.46 |
| A8 | 900 | 100 | 3.31 | 7.69 | 48 | 20.8 | 11.8 | 19.5 | 0.8 | 0.9 | 0.46 |
| A9 | 900 | 100 | 3.31 | 7.69 | 48 | 20.8 | 11.8 | 19.5 | 0.8 | 0.75 | 0.52 |

TABLE 7

| Sample No. | Insulating Resistance Ω | Sinterability | DC superposition Characteristics (A/m) | DC superposition coefficient | Bending Strength Mpa | Adhesive Property | Evaluation |
|---|---|---|---|---|---|---|---|
| 27 | 3.10E+10 | ○ | 248 | 42904 | 203 | ○ | ○ |
| A1 | 4.42E+10 | ○ | 522 | 43269 | 206 | ○ | ○ |
| A2 | 2.21E+11 | ○ | 323 | 47601 | 220 | ○ | ○ |
| A3 | 3.51E+10 | ○ | 308 | 46800 | 218 | ○ | ○ |
| A4 | 2.29E+10 | ○ | 315 | 47200 | 216 | ○ | ○ |
| A5 | 4.21E+10 | ○ | 402 | 46201 | 209 | ○ | ○ |
| A6 | 1.21E+11 | ○ | 534 | 46075 | 218 | ○ | ○ |
| A7 | 4.83E+10 | ○ | 725 | 43500 | 195 | ○ | ○ |
| A8 | 2.27E+10 | ○ | 870 | 43500 | 200 | ○ | ○ |
| A9 | 8.03E+10 | ○ | 822 | 46032 | 211 | ○ | ○ |

As shown in FIGS. 6 and 7, the added amounts of the sub-components of the magnetic material were variously changed. As a result, in all of the samples 1 to 9 with the sub-component added, the DC superposition coefficient was higher (more than 43000) than that in the sample 27 to attain good results.

While specific preferred embodiments have been shown and described, the present invention is never limited by these specific embodiments, and can be carried out with various modifications and substitutions without departing from the scope of the claims thereof.

The invention claimed is:

1. A composite electronic part comprising magnetic and dielectric materials, the part being made by co-sintering at a temperature of 1000° C. or lower,
   wherein the magnetic material comprises a ferrite comprising 46 to 48 mol % of $Fe_2O_3$, 15 to 36 mol % of ZnO, 10 to 14 mol % of CuO and the balance being NiO;
   wherein the dielectric material has a dielectric constant of 1000 or higher; and
   wherein the dielectric material comprises a barium titanate based dielectric material to which 0.5 weight parts or more and 4.0 weight parts or less of CuO and 4.0 weight parts or more and 9.0 weight parts or less of $Bi_2O_3$ are added with respect to 100 weight parts of the barium titanate based dielectric material.

2. The composite electronic part of claim 1, wherein each of the magnetic and dielectric materials has an insulating resistance of $1.0 \times 10^{10} \Omega$ or more by itself.

3. The composite electronic part of claim 1, further comprising an intermediate layer between the magnetic and dielectric materials, the intermediate layer comprising a porcelain comprising 100 weight parts of a BaO—$TiO_2$—ZnO material to which 8 weight parts or less of CuO is added.

4. The composite electronic part of claim 1, further comprising a conductive pattern on each of the dielectric and magnetic materials, the conductive pattern comprises at least one of Ag, Cu and an Ag—Pd alloy.

5. The composite electronic part of claim 1 for noise suppression.

6. A composite electronic part comprising magnetic and dielectric materials, the part being made by co-sintering at a temperature of 1000° C. or lower,
   wherein the magnetic material comprises 100 weight parts of a ferrite composition comprising 46 to 48 mol % of $Fe_2O_3$, 15 to 36 mol % of ZnO, 10 to 14 mol % of CuO and the balance being NiO, and sub-components of 0.8 weight parts or lower of $Bi_2O_3$, 0.9 weight parts or lower of $TiO_2$, and 0.52 weight parts or lower of BaO;
   wherein the dielectric material has a dielectric constant of 1000 or higher; and
   wherein the dielectric material comprises a barium titanate based dielectric material to which 0.5 weight parts or more and 4.0 weight parts or less of CuO and 4.0 weight parts or more and 9.0 weight parts or less of $Bi_2O_3$ are added with respect to 100 weight parts of the barium titanate based dielectric material.

7. The composite electronic part of claim 6, wherein each of the magnetic and dielectric materials has an insulating resistance of $1.0 \times 10^{10} \Omega$ or more by itself.

8. The composite electronic part of claim 6, further comprising an intermediate layer between the magnetic and dielectric materials, the intermediate layer comprising a porcelain comprising 100 weight parts of a BaO—$TiO_2$—ZnO material to which 8 weight parts or less of CuO is added.

9. The composite electronic part of claim 6, further comprising a conductive pattern on each of the dielectric and magnetic materials, the conductive pattern comprises at least one of Ag, Cu and an Ag—Pd alloy.

10. The composite electronic part of claim 6 for noise suppression.

* * * * *